US007221460B2

(12) United States Patent
Ohtsuka (10) Patent No.: US 7,221,460 B2
(45) Date of Patent: May 22, 2007

(54) OPTICAL SYSTEM IN EXPOSURE APPARATUS, AND DEVICE MANUFACTURING METHOD

(75) Inventor: Masaru Ohtsuka, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 521 days.

(21) Appl. No.: 10/779,213

(22) Filed: Feb. 13, 2004

(65) Prior Publication Data
US 2004/0227915 A1   Nov. 18, 2004

(30) Foreign Application Priority Data

| Feb. 13, 2003 | (JP) | ............................... 2003-035545 |
| Jan. 20, 2004 | (JP) | ............................... 2004-011791 |

(51) Int. Cl.
*G01B 9/02* (2006.01)
(52) U.S. Cl. .................................................... 356/508
(58) Field of Classification Search ................ 356/508, 356/509, 490, 500
See application file for complete search history.

(56) References Cited

U.S. PATENT DOCUMENTS 6,160,628 A *  12/2000  Inoue ........................ 356/500

6,563,592 B2 *  5/2003  Mitchell et al. ............ 356/508

* cited by examiner

*Primary Examiner*—Hwa (Andrew) Lee
(74) *Attorney, Agent, or Firm*—Morgan & Finnegan, LLP (57) ABSTRACT

Disclosed is an optical system having a plurality of optical elements, for use in an optical instrument or a projection exposure apparatus, arranged to maintain a best optical performance by controlling a relative position of the plurality of optical elements. The optical system includes a reference mirror, a first measuring system for measuring a relative position, with respect to the reference mirror, of a first optical element among the plurality of optical elements and/or a first target mirror disposed so that a relative position thereof with respect to the first optical element is kept substantially unchanged, and a second measuring system for measuring a relative position, with respect to the reference mirror, of a second optical element among the plurality of optical elements and/or a second target mirror disposed so that a relative position thereof with respect to the second optical element is kept substantially unchanged. At least one of the first and second optical elements is moved on the basis of the measurement so that a relative positional relationship between the first and second optical elements is placed in predetermined positional relationship.

35 Claims, 8 Drawing Sheets

OPTICAL SYSTEM IN EXPOSURE APPARATUS, AND DEVICE MANUFACTURING METHOD

FIELD OF THE INVENTION AND RELATED ART

This invention relates generally to an optical system and an exposure apparatus having the same. More particularly, the invention is suitably applicable to an optical system to be used in a photolithographic process wherein light of very short wavelength, called extreme ultraviolet (EUV) light, is used to project a pattern of a reticle onto a wafer, for manufacture of semiconductor devices such as IC or LSI, liquid crystal display devices, or thin-film magnetic heads, for example.

As regards an optical system to be used in a projection exposure apparatus for manufacture of semiconductor devices based on ultraviolet light, for photoprinting an original pattern (reticle) on a wafer, the lens surfaces of a lens made of a glass or a certain crystal material is polished at high precision, and then a plurality of such simplex lenses are assembled within a barrel with there optical axes aligned with each other. In order to produce a high-precision optical system, the optical axis of plural lenses must be aligned very exactly. For assuring alignment of optical axes of lenses, a metal cylindrical member called a barrel whose internal diameter is machined at high precision is used, and the alignment is performed mechanically by inserting the lenses into this barrel.

In regard to semiconductor device manufacturing projection exposure apparatuses using EUV light (hereinafter "EUV exposure apparatus"), there is only a few transfer materials (optical materials) in such wavelength region. Additionally, even such materials have refractive index close to 1 and, therefore, it is very difficult to produce a lens that can bend a light ray as desired, like the case of ultraviolet light. It is generally necessary to use an optical system having a plurality of mirror being coated with a special reflection enhancing multilayered film, to project a pattern of a reticle onto a wafer.

With this limitation, an optical system to be used in EUV exposure apparatuses needs a projection exposure system constituted by mirrors only. In optical design, generally the optical axes of mirrors are registered with each other. In production, however, an off-axis region in which an effective region is away from the optical axis is used, and the outside shape of the mirror is not circular but is formed with a notch so as to keep a path for the light.

Regarding the projection resolution required for EUV exposure apparatuses, the linewidth is narrower than about 50 nm, and very fine pattern exposure is expected. Thus, the quantity of aberration allowable in the EUV exposure apparatuses is extraordinarily small. Furthermore, since EUV light is attenuated largely in air, the optical system for projection exposure must be placed in a high vacuum. Therefore, it is difficult to accomplish adjustment of optical elements and performance maintenance based on conventional mechanical size.

A barrel structure having a function of fine-motion adjustment for simplex lenses constituting a projection exposure lens, has been known although it is not for use with EUV light. An example is that each mirror is provided with a six-freedom fine-motion mechanism having an actuator. The adjustment target position of each mirror is adjusted on the basis of a signal from a displacement sensor disposed adjacent the actuator.

However, generally, measurement based on a displacement sensor has a difficulty in assuring its absolute position very precisely. For example, in the case of a sensor, like an electrostatic capacitance sensor, which is based on the principle that the clearance between the sensor and the target is measured while replacing it with an electrical characteristic value as "capacitance", if the power is turned off and again it is turned on, in many cases the position specified by the displacement sensor differs from the same physical position before the power off, due to a drift of an electric circuit that detects the capacitance, for example. Further, in the case of a sensor, like optical scale, that has a physical reference, the absolute position can be assured at the level of physical stability of the scale. However, since such optical scale is mounted on a barrel, if the barrel (mounted position) deforms due to thermal expansion or stress, the relative position of the optical element is no more assured.

It is accordingly an object of the present invention to provide an optical system by which a relative positional relationship of a plurality of optical elements held within a barrel can be maintained at optimum optical performance, and/or an exposure apparatus having such optical system.

It is another object of the present invention to provide an optical instrument and a projection exposure apparatus having the same, in which a structurally independent reference member separate from a barrel for holding a projection optical system is provided and a measuring means (measuring system) for measuring an absolute distance of each optical element, constituting the projection optical system, from that reference member is used, such that the relative positional relationship of the optical elements having been accomplished at a certain time moment can be easily retrieved even after an event of state variation such as transportation, long-term interruption, breakdown, changes with time, and the like, and thus good optical performance can be maintained stably.

In accordance with an aspect of the present invention, there is provided an optical system having a plurality of optical elements, comprising: a reference mirror; a first measuring system for measuring a relative position, with respect to said reference mirror, of a first optical element among the plurality of optical elements and/or a first target mirror disposed so that a relative position thereof with respect to the first optical element is kept substantially unchanged; a second measuring system for measuring a relative position, with respect to said reference mirror, of a second optical element among the plurality of optical elements and/or a second target mirror disposed so that a relative position thereof with respect to the second optical element is kept substantially unchanged; and a driving mechanism for moving at least one of the first and second optical elements on the basis of a result of measurement made by said first and second measuring systems, so that a relative positional relationship between the first and second optical elements is placed in a predetermined positional relationship.

In one preferred form of this aspect of the present invention, said first and second measuring systems have a function for measuring positional information of three or more freedoms, in relation to each of the first and second target mirrors.

Among the three freedoms, two freedoms may be freedoms related to a coordinate axis representing a position, while the remaining one freedom may be a freedom related to a coordinate axis representing rotation.

The first and second measuring systems may have a function for measuring positional information of five or more freedoms, in relation to each of the first and second target mirrors.

Among the five freedoms, two freedoms may be freedoms related to a coordinate axis representing a position, while the remaining three freedoms may be freedoms related to a coordinate axis representing rotation.

The optical system may further comprise a barrel for supporting the first and second optical elements, wherein said reference mirror may be provided outside the barrel.

The reference mirror may be a member made of a low thermal expansion material and processed into a plane mirror with an anti-reflection film provided only in a required portion thereof.

The first and second measuring systems may measure an absolute distance between said reference mirror and the first target mirror and between said reference mirror and the second target mirror, wherein each of said fist and second measuring systems may include an interferometer system based on a multiple-wavelength laser.

The first and second measuring systems may measure a distance between said reference mirror and the first target mirror and between said reference mirror and the second target mirror, wherein each of said fist and second measuring systems includes an interferometer system based on a single-wavelength laser, wherein said optical system may further comprise a displacement sensor provided in relation to an optical element of said optical system, the displacement sensor providing a positional precision of an order equivalent to a half of the wavelength of the single-wavelength laser.

The optical system may further comprise storing means for memorizing the relative position of the first and second optical elements of said optical system, in terms of distances of the first and second optical elements with respect to said reference mirror, wherein said driving mechanism may move the optical elements in corporation with said storing means.

The storing means may store the relative position of the optical elements in a state in which said optical system can provide a desired optical performance, in terms of the distance of the optical elements to said reference mirror.

The optical system may further comprise (i) a third measuring system for measuring a relative position, with respect to said reference mirror, of a third optical element among the plurality of optical elements and/or a third target mirror disposed so that a relative position thereof with respect to the third optical element is kept substantially unchanged, (ii) a fourth measuring system for measuring a relative position, with respect to said reference mirror, of a fourth optical element among the plurality of optical elements and/or a fourth target mirror disposed so that a relative position thereof with respect to the fourth optical element is kept substantially unchanged, (iii) a fifth measuring system for measuring a relative position, with respect to said reference mirror, of a fifth optical element among the plurality of optical elements and/or a fifth target mirror disposed so that a relative position thereof with respect to the fifth optical element is kept substantially unchanged, (iv) a sixth measuring system for measuring a relative position, with respect to said reference mirror, of a sixth optical element among the plurality of optical elements and/or a sixth target mirror disposed so that a relative position thereof with respect to the sixth optical element is kept substantially unchanged, and (v) a second driving mechanism for moving at least five optical elements of the first to sixth optical elements on the basis of a result of measurement made by said first to sixth measuring systems, so that a relative positional relationship of the first to sixth optical elements can be placed in a predetermined positional relationship.

All the optical elements may be reflection members.

The optical system may further comprise storing means for memorizing an optimum relative positional relationship of the plurality of optical elements, wherein said driving mechanism may move at least one of the plurality of optical elements on the basis of a result of measurement made by said measuring systems and the optimum positional relationship memorized in said storing means.

In accordance with another aspect of the present invention, there is provided an exposure apparatus including an optical system as recited above.

In accordance with a further aspect of the present invention, there is provided an exposure apparatus, comprising: an illumination optical system for illuminating a pattern with light from a light source; and an optical system as recited above, for projecting light from the pattern onto a member to be exposed.

In one preferred form of these aspects of the present invention, the exposure apparatus further comprises a barrel for holding the plurality of optical elements, and a barrel base for supporting said barrel, wherein said reference mirror is separate from said barrel and is mounted on said barrel base.

The exposure apparatus may further comprise a barrel for holding the plurality of optical elements, a barrel base for supporting said barrel, and a first anti-vibration mechanism disposed between said barrel base and a floor, for reducing vibration propagated from said floor to said barrel base.

The exposure apparatus may further comprise a barrel for holding the plurality of optical elements, a barrel base for supporting said barrel, a first anti-vibration mechanism disposed between said barrel base and a floor, for reducing vibration propagated from said floor to said barrel base, a mirror base for supporting said reference mirror, and a second anti-vibration mechanism disposed between said mirror base and said floor, for reducing vibration propagated from said floor to said mirror base.

In the exposure apparatus above, regard to at least a portion of vibration of said barrel base, said mirror base may be controllably vibrated in synchronism therewith.

In accordance with a yet further aspect of the present invention, there is provided a device manufacturing method, comprising the steps of: exposing a wafer by use of an exposure apparatus as recited above; and developing the exposed wafer.

In accordance with a still further aspect of the present invention, there is provided a position adjusting method in an optical system having at least one optical element, for adjusting a position of the at least one optical element, comprising the steps of: measuring a relative position, with respect to a reference mirror, of the at least one optical element and/or of a target mirror disposed so that a relative position thereof with respect to the at least one mirror is kept substantially unchanged; and moving the at least one optical element and/or the target mirror on the basis of a result of measurement at said measuring step so that it is placed at a predetermined position.

In one preferred form of this aspect of the present invention, the optical system includes a plurality of optical elements, wherein said method further comprises a storing step for memorizing a relative positional relationship of the plurality of optical elements in a state in which the optical system can provide a desired optical performance, wherein in said measuring step a relative positional relationship of the plurality of optical elements is measured, and wherein in said moving step at least one optical element of the plurality of optical elements is moved on the basis of a result of measurement and of information stored in said storing step.

The storing step may be carried out by use of storing means in which a relative positional relationship of the plurality of optical elements before transportation is stored beforehand, wherein said measuring step may be carried out after the transportation, and wherein at least one optical element is moved in said moving step on the basis of the result of measurement and of the information stored at said storing step.

In accordance with a yet further aspect of the present invention, there is provided an optical instrument, comprising: a plurality of optical elements; a barrel for holding the plurality of optical elements; a target mirror arranged so that a relative position thereof with respect to one or more optical elements of the plurality of optical elements is kept substantially unchanged; driving means for moving the one or more optical elements; a reference mirror provided outside said barrel; measuring means for measuring a position of said target mirror with respect to said reference mirror; and storing means for memorizing an optimum relative positional relationship of the plurality of optical elements, wherein said driving means moves at least one of the plurality of optical elements on the basis of a result of measurement made by said measuring means and of the optimum positional relationship memorized in said storing means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First Embodiment

Figure 1:
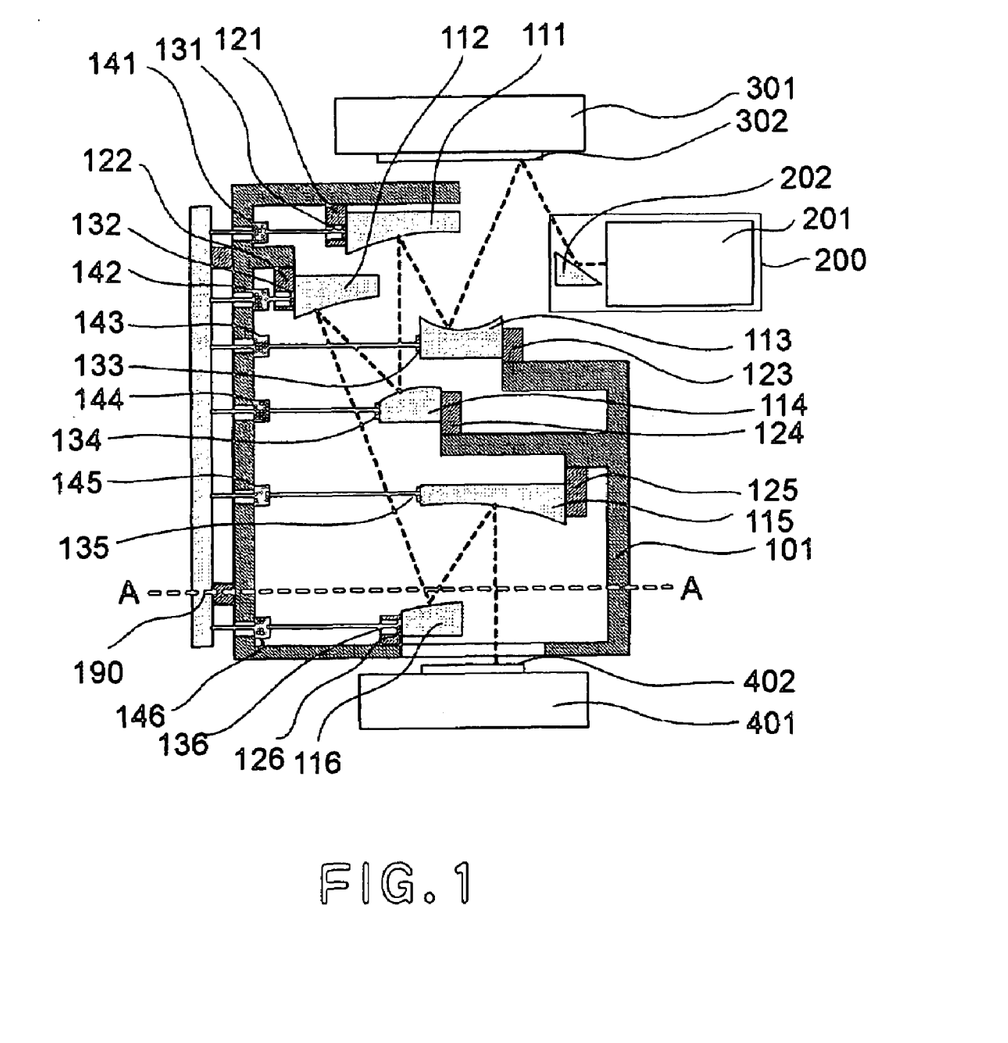
FIG. 1 is a schematic view of a main portion of a first embodiment of the present invention.
Figure 2:
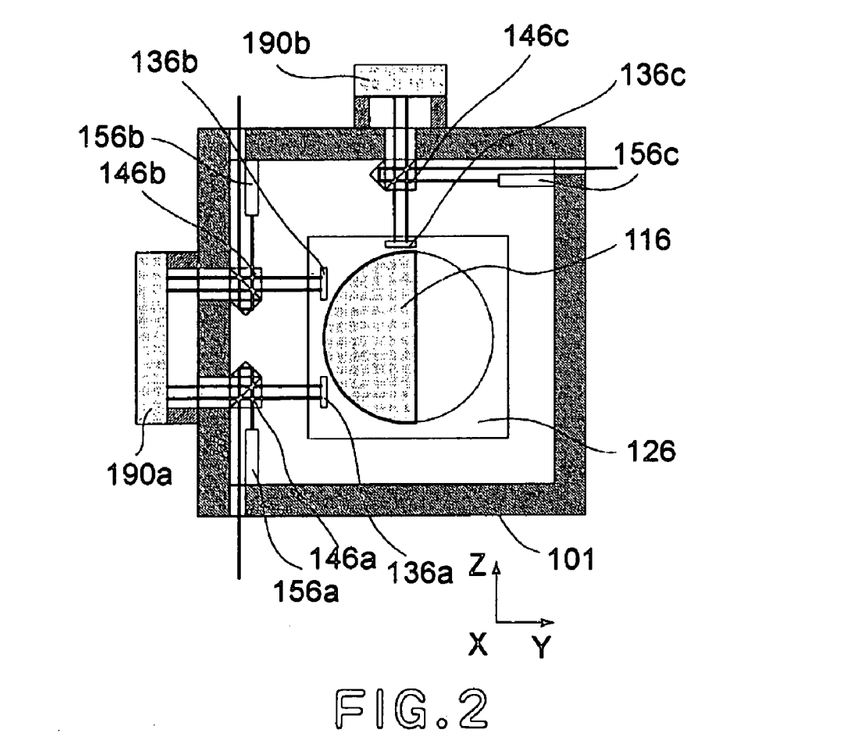
FIG. 2 is a sectional view taken along a line A-A in FIG. 1.

FIG. 1 is a schematic view of a main portion of a first embodiment of the present invention. FIG. 2 is a sectional view taken along a line A-A in FIG. 1.

This embodiment concerns an exposure apparatus (mainly a projection optical system) using EUV light, wherein a pattern formed on a reticle (mask) 302 is projected onto a wafer 402 at a predetermined reduction magnification. Where the projection exposure apparatus is step-and-repeat type, one region on the wafer 402 is exposed simultaneously. In a step-and-scan method, a reticle state 301 and a wafer state 401 are moved in synchronism with each other in accordance with the ratio of reduction magnification to scanningly expose the wafer.

Denoted at 200 is an illumination optical system, and it illuminates a fine pattern formed on the reticle (mask) 302, with light (EUV light) from a light source unit 201 and through a mirror 202. Reflection light from the reticle 302 illuminated is directed to the wafer 402 by way of first to sixth mirrors 111-116 (projection optical system). The order of reflection, by the mirrors, of the light from the reticle 302 is third mirror 113, first mirror 111, fourth mirror 114, second mirror 112, sixth mirror 116, and fifth mirror 115.

In this embodiment, a pattern formed on the reticle 302 is projected, in a reduced scale, on the wafer 402 through the projection optical system that includes first to sixth mirrors having positive, positive, negative, positive, negative, and positive refractive powers.

However, the refractive power arrangement is not limited to this, and other structures having a plurality of mirrors are applicable.

One or more of these mirrors have a rotationally asymmetrical shape wherein a portion of its outer configuration is removed so as to reduce a third L of light system from the pattern of the reticle 302.

The patter of the reticle 302 is placed in a predetermined region outside the optical axis of the projection optical system. The projection optical system uses an off-axis region only, to project the pattern of the reticle 302 onto the wafer 402 in a reduced scale. As regards the projection exposure region, a ring-like region off the optical axis, for example, is used as an effective region.

Here, the light source unit 201 includes an optical system for directing light to a bending mirror 202. Denoted at 301 is a reticle stage for supporting and moving the reticle 302. Denoted at 401 is a wafer stage for supporting and moving the wafer 402.

Denoted at 101 is a barrel mainly for supporting optical elements 111-116, constituting the projection optical system. Denoted at 121, 122, 123, 124, 125 and 126 are first, second, third, fourth, fifth and sixth fine-motion mechanisms (driving means), respectively, for fine-motion driving the first to sixth mirrors 111-116, respectively. Denoted at 131, 132, 133, 134, 135 and 136 are first, second, third, fourth, fifth, and sixth target mirrors, respectively. Denoted at 141, 142, 143, 144, 145 and 146 are first, second, third, fourth, fifth and sixth absolute length measurement interferometers, respectively, each being a measuring device for detecting an absolute distance by causing interference of plural lights having different wavelengths. These interferometers function to measure the distances of the target mirrors 131-136 with respect to a reference mirror 190. The reference mirror 190 is made of a material and disposed at a position that, even if the optical elements 111-116 or supports for these optical elements causes expansion, contraction or deformation due to exposure heat or the like, the position thereof is substantially unchanged and substantially no deformation is produced therein.

The target mirrors 131-136 are disposed close to the first to sixth mirrors 111-116, respectively, or alternatively, they are disposed integrally with these mirrors, respectively. Thus, the target mirrors are provided so that, regardless of temperature change, the relative positional relationship between the first to sixth mirrors 111-116 and the target mirrors 131-136 is unchanged. The absolute length measurement interferometers 141-146 measure the absolute distances between the target mirrors 131-136 and the reference mirror 190, respectively, wherein the reference mirror 190 is mounted on the barrel 101 in the manner effective to reduce positional change or deformation.

Regarding the position of the reference mirror 190, it may be disposed at any position provided that the relative position with respect to the barrel 101 is substantially unchanged and substantially no deformation is produced. For example, it may preferably be disposed outside the barrel 101, or it may desirably be disposed at a position behind an optical element that intercepts radiation heat from the first to sixth mirrors 111-116 or any other heat source. Specific examples are illustrated in FIG. 9 (modified example 1) and FIG. 10 (modified example 2).

Figure 9:
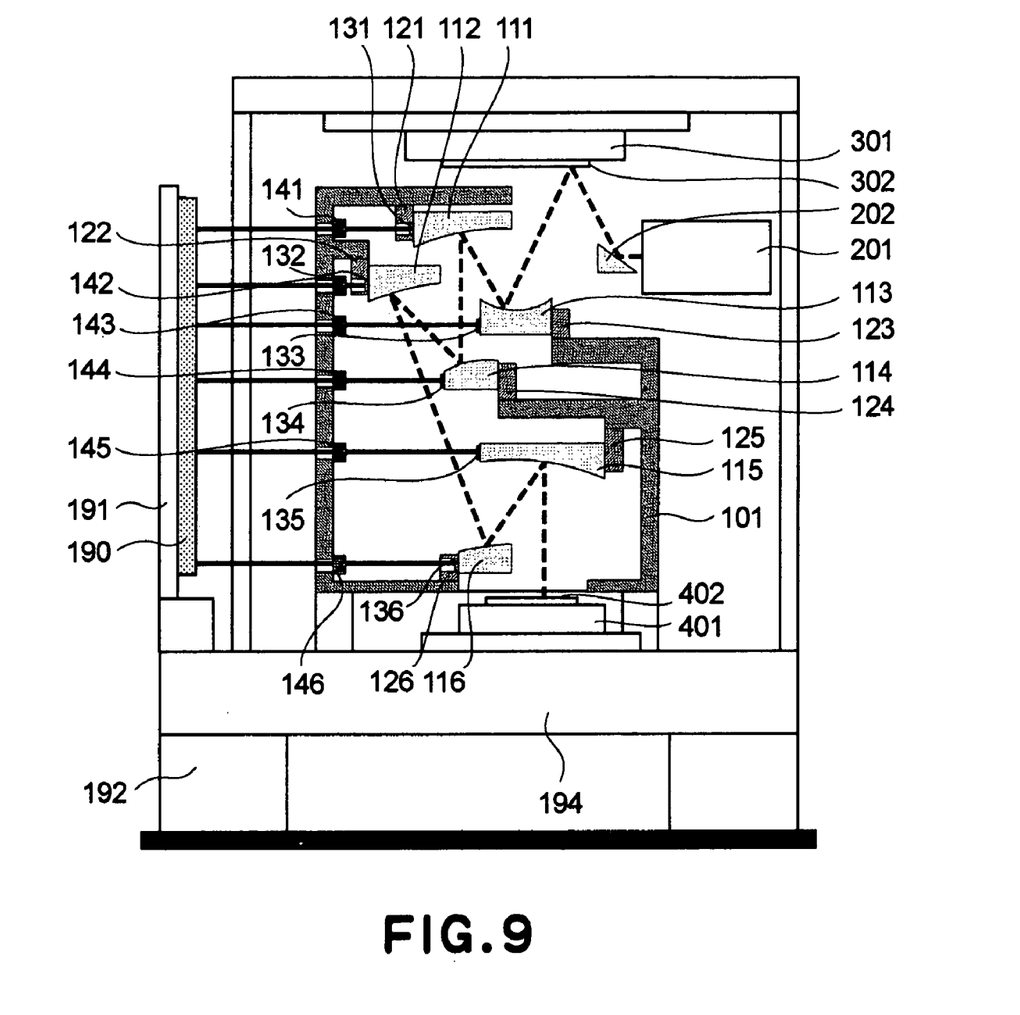
FIG. 9 is a schematic view of a main portion of a modification example of the first embodiment of the present invention.

In FIG. 9, a reference mirror 190 and a reference mirror supporting member 191 for supporting the reference mirror 190, are mounted on a barrel base 194 that supports a barrel. Here, the barrel base is disposed on a barrel anti-vibration table having a function for reducing or avoiding vibration from the floor. The reference mirror supporting member 191 is preferably made of a low thermal-expansion material such as Zerodur, for example. With this structure, vibration of the reflection surface (reference reflection surface) of the reference mirror can follow low-frequency vibration of the whole barrel 101, and relative alignment of the mirrors 111-116 can be accomplished very accurately.

Figure 10:
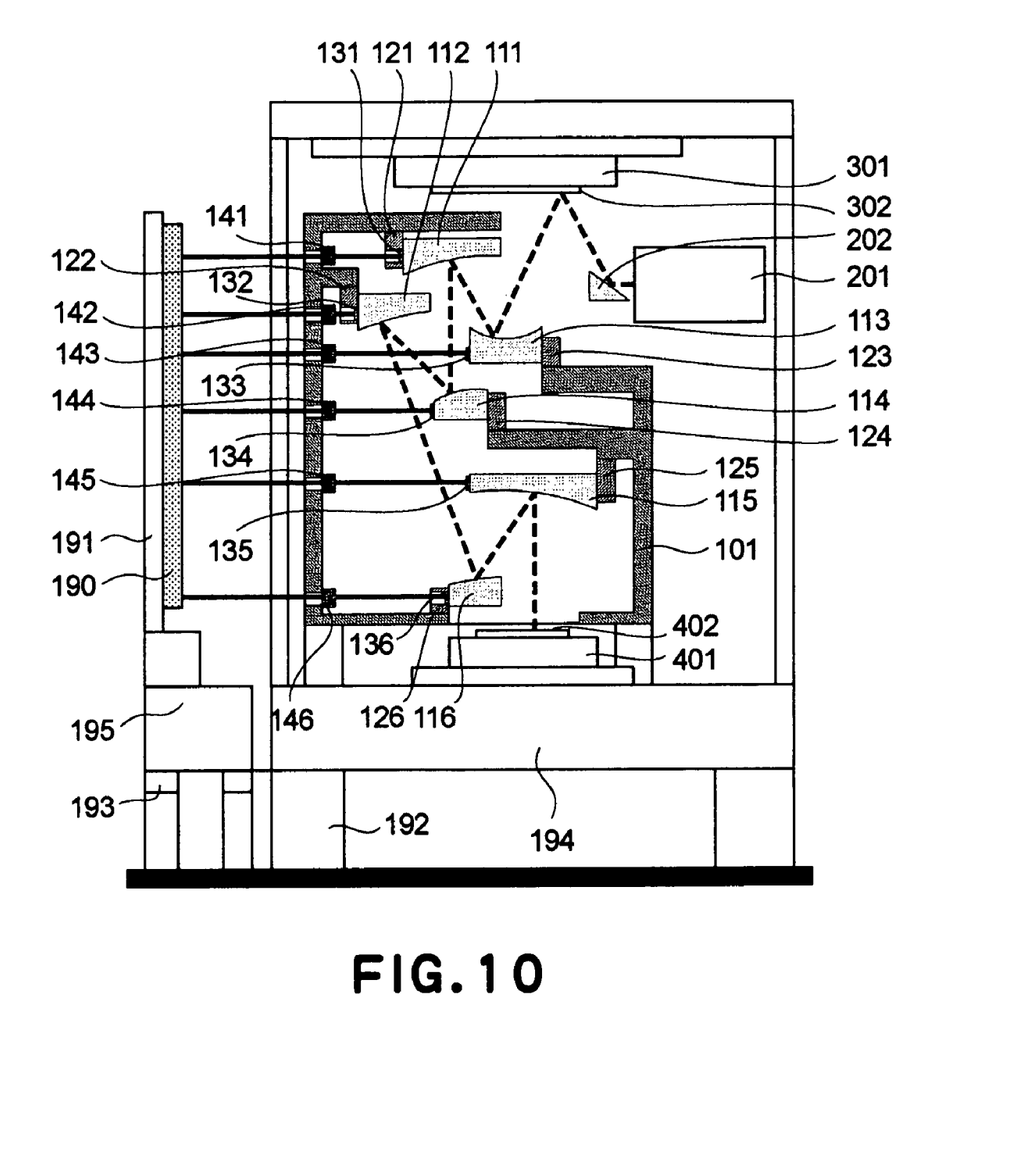
FIG. 10 is a schematic view of a main portion of a second modification example of the first embodiment of the present invention.

In FIG. 10, there is a reference mirror base 195 which is separate from a barrel base that supports a barrel. A reference mirror 190 and a reference mirror supporting member 191 are mounted on the reference mirror base 195. Here, the reference mirror base 195 is supported on the floor through a reference mirror anti-vibration table and, by using this reference mirror anti-vibration table, vibration from the floor is reduced. Furthermore, this reference mirror base 195 may be provided with a position sensor for measuring a relative position with respect to the barrel base, and preferably they may be structured so that, in response to low-frequency vibration of the barrel, the reference mirror base vibrates to follow it.

In the examples of FIGS. 9 and 10, the reference mirror is disposed inside a chamber (not shown) that surrounds a space containing the barrel, and the inside of the chamber is filled with a vacuum ambience.

In this embodiment, alignment of the mirror is performed along the X-Y plane (approximately horizontal plane). However, as a matter of course, it may be performed with respect to Z direction (approximately vertical direction and in the optical axis direction). Specifically, a bending mirror or bending prism for bending, by reflection, light from an interferometer such as shown in FIG. 1, 2, 9 or 10, approximately in the Z direction may be provided and, additionally, target mirrors may be provided on the first to sixth mirrors or those members that support the first to sixth mirrors, the target mirrors having a reflection surface facing the vertical direction. The light from the bending mirror or bending prism may be directed to the target mirrors. Then, by using a similar interferometer as shown in FIG. 1, 2, 9 or 10 (namely, causing interference of light by use of the reference mirror outside the barrel), the positions of the first to sixth mirrors with respect to the Z direction can be measured. On the basis of the result of measurement, the positions of the first to sixth mirrors in the Z direction may be adjusted. Here, the bending mirror or bending prism may be mounted integrally upon the first to sixth mirrors or members that support these mirrors. This structure, that is, the structure that the light in the X-Y plane (light ray or light beam for position measurement) is bent in the Z direction and the thus deflected light is directed to the target mirrors mounted to the first to sixth mirrors thereby to measure the positions of the first to sixth mirrors, is included in the scope of the present invention. Where the Z-direction alignment of the first to sixth mirrors is carried out in accordance with such structure described above, preferably, the Z-direction alignment should be done after completion of alignment along the X-Y plane and alignment of rotational axes about X and Y axes.

Additionally, the reference mirror 190 and the target mirrors 131-136 may preferably be made of a material whose thermal deformation is small.

The absolute length measurement interferometer may be such as shown in Japanese Laid-Open Patent Application No. H03-009202, for example, and it functions to exactly measure the spacings themselves between the reference mirror 190 and the target mirrors 131-136 on the basis of multiple wavelengths.

Referring now to FIG. 2, components shown in the section taken along a line A-A in FIG. 1, will be described. In FIG. 2, denoted at 116 is the sixth mirror, and denoted at 126 is the sixth fine-motion mechanism. Denoted at 136*a*, 136*b* and 136*c* are target mirrors, and denoted at 146*a*, 146*b* and 146*c* are absolute length measurement interferometers. Denoted at 156*a*, 156*b* and 156*c* are light receiving units associated with the absolute length measurement interferometers, respectively. Denoted at 190*a* and 190*b* are reference mirrors. It is not always necessary that all the first to sixth mirrors 111-116 are provided with target mirrors and fine-motion mechanisms such as described above, and these elements may be provided selectively on two or more mirrors. In this example, target mirrors and fine-motion mechanisms are provided in relation to the sixth mirror 116.

The number of target mirrors and fine-motion mechanisms to be provided in association with one optical element (mirror) may be anyone, that is, one or more.

As regards the absolute length measurement interferometers 146*a*-146*c*, in the horizontal plane as shown in FIG. 2, the absolute distances between the target mirrors 136*a*, 136*b* and 136*c* disposed close to or integrally with the sixth mirror 116 and the reference mirrors 190*a* and 190*b* mounted on the barrel 101 in the manner effective to reduce deformation, can be measured by these absolute length measurement interferometers 146*a*-146*c*. Here, the light coming via the target mirrors 136*a*-136*c* is converted into electric signals by means of the light receiving units 156*a*-156*c*, and subsequently, these signals are converted by a hardware (not shown) into digital data that can be handled by a computer. By using the absolute length measurement interferometers 146*a*-146*c* as described above, the position of the sixth mirror 116 along the horizontal plane (a plane containing the sheet of FIG. 2) and with respect to the barrel 101, as well as rotation of the mirror in the horizontal plane, can be measured.

Figure 5:
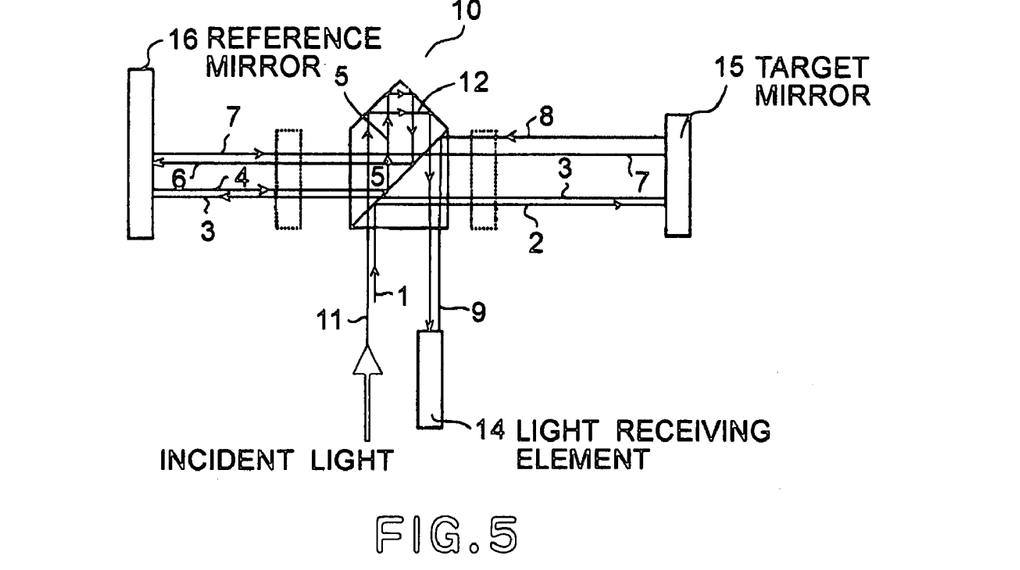
FIG. 5 is a schematic view for explaining details of a portion of FIG. 2.

Referring to FIG. 5, the light path for the interferometers will be explained in greater detail. Among the incident light directed from a light source, reference light is bent back within a prism 10, made by adhering a triangular pole element or square pyramid element to an approximately cubic member, and it impinges on a light receiving element. Namely, the light traces light paths denoted at 11, 12 and 13, and is incident on the light receiving element 14. On the other hand, among the incident light, a measurement light (to be measured) enters the prism 10 and is reflected thereby and, after emerging from the prism 10, it goes via target mirror 15 (reflection), prism 10 (transmission), reference mirror 16 (reflection), prism 10 (reflection), reference mirror 16 (reflection), prism 10 (transmission), target mirror 15 (reflection), and prism 10 (reflection), and it impinges on the light receiving element 14. Namely, the light traces light paths denoted at 1, 2, 3, 4, 5, 6, 7, 8 and 9, and it is incident on the light receiving element 14. Here, the prism 10 may be replaced by a combination of a polarization beam splitter and a mirror. Further, between the prism and the target mirror and between the prism and the reference mirror 16, there are quarter waveplates ($\lambda/4$ plates).

As regards a light source for use in such absolute length measurement interferometer, a light source having a plurality of wavelengths may be used to produce an equivalently long wavelength. After the absolute optical path length is narrowed down to a certain range, phase measurement is performed with a single wavelength to determine the length at a precision narrower than the wavelength. In one of such plural-wavelength light source, wavelength control is made to lock the wavelength with reference to a stable absorption band such as an absorption band of iodine gas molecules (iodine absorption line). Therefore, the wavelength of light from the light source would present a wavelength variation of only a small amount of $10^{-9}$ times the wavelength thereof. Thus, where such a light source is used, there occurs an error of only a small amount of $10^{-9}$ times the subject distance to be measured. This means that the distance between the reference mirror and the target mirror, if it is 1000 mm, can be assured with a precision of 1 nm.

Figure 3:
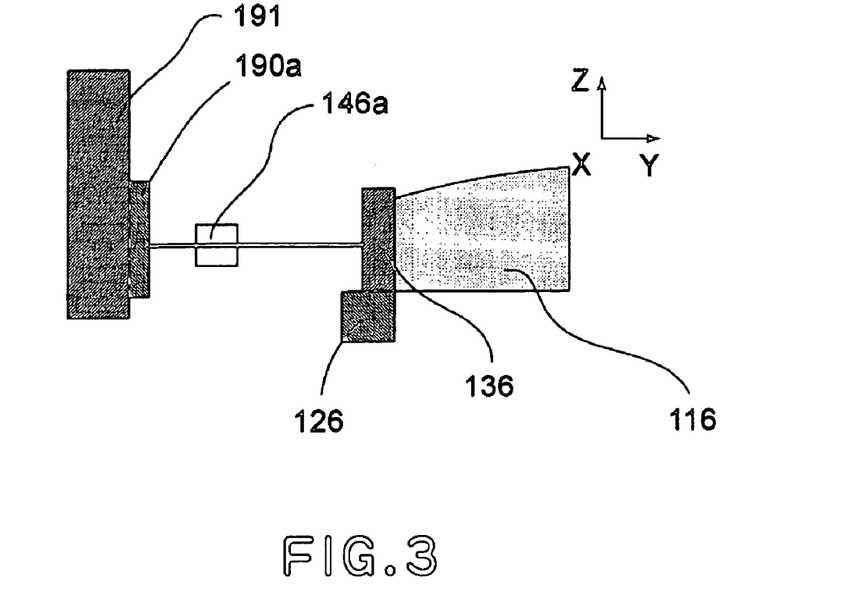
FIG. 3 is a schematic view for explaining a modification to the first embodiment.

In this embodiment, the absolute distances between the reference mirror 190a and the target mirrors 136a and 136b are measured by means of the interferometers 146a and 146b. However, the invention is not limited to this. The reference mirror 190a with respect to which the absolute distances to the target mirrors 136a and 136b are going to be measured, is not always required to have an integral mirror surface. It may have separate mirror surfaces, that is, the system may have a reference mirror for measurement of the absolute distance with respect to the target mirror 136a and a separate reference mirror for measurement of the absolute distance with respect to the target mirror 136b. For example, in relation to each target mirror, as shown in FIG. 3, a reference mirror 190a mounted to the barrel through a holding member 191 by adhesion or screw bonding may be used.

Figure 4:
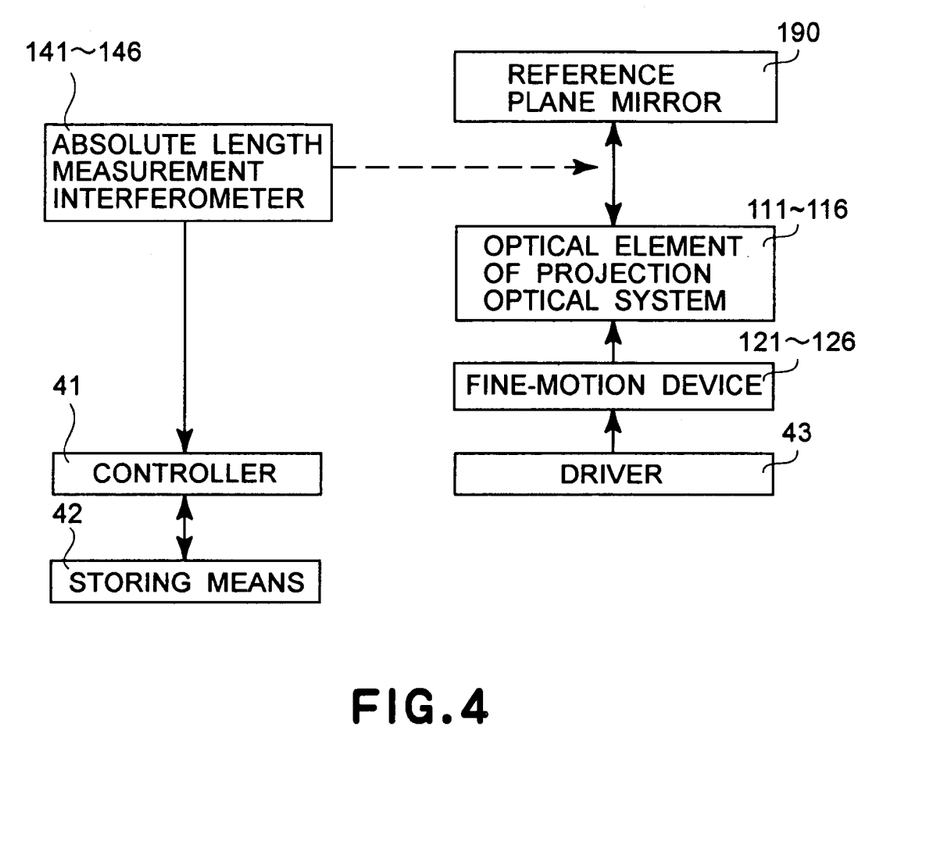
FIG. 4 is a flow chart for explaining the operation of the first embodiment.

As regards the first to sixth mirrors 111-116, exact adjustment is performed by use of fine-motion mechanisms 121-126 on the basis of a transmission wavefront interferometer or printing evaluation results. After the exposure performance is confirmed, as shown in FIG. 4, positional relation data for the mirrors 111-116 is measured by use of the absolute length measurement interferometers 141-146, and the data is stored into a storing unit (storing means) annexed to a controller (control means). With this structure, after the exposure apparatus is transported into a semiconductor factory, or after the exposure apparatus is interrupted for a certain time period, or after electric power failure, the positions of the first to sixth mirrors 111-116 can be adjusted again on the basis of the stored data. Specifically, the fin-motion mechanisms 121-126 can be actuated to correct any changes in the relative positional relationship of the mirrors 111-116 even if they occur. Therefore, a desired optical performance of the exposure apparatus can be held stably.

In summary, in the projection exposure apparatus shown in FIG. 1, where a direction perpendicular to the sheet of the drawing is X axis, a direction approximately perpendicular to the reticle or wafer is Z axis, and a direction perpendicular to the X axis or Z axis is Y axis (in FIG. 2, a direction perpendicular to the sheet of the drawing is Z axis, a direction juxtaposed with the target mirrors 136a and 136b is X axis, and a direction perpendicular to both of Z and X axes is Y axis), the first embodiment assures a positional change in X axis, Y axis and Wz axis (a rotational axis about the Z axis).

Referring to FIG. 4, the operation of the projection exposure apparatus will be explained briefly. In this example, the positions of the optical elements (first to sixth mirrors) 111-116 with respect to the reference mirror 190 are measured by means of absolute distance measuring systems (absolute length measurement interferometers) 141-146, and the results of measurement are supplied to a controller 41 and they are stored into a storing means 42. After elapse of a certain time period, the position with respect to the reference mirror 190 is measured similarly by use of the absolute distance measuring systems 141-146. If there is a deviation between the measurement result and the data stored in the storing means 42, the controller 41 supplies a command to the fine-motion mechanisms 121-126 through a driver 43. In accordance with the supplied command, the fine-motion mechanisms 121-126 move the optical elements 111-116 of the projection optical system.

Second Embodiment

Figure 6:
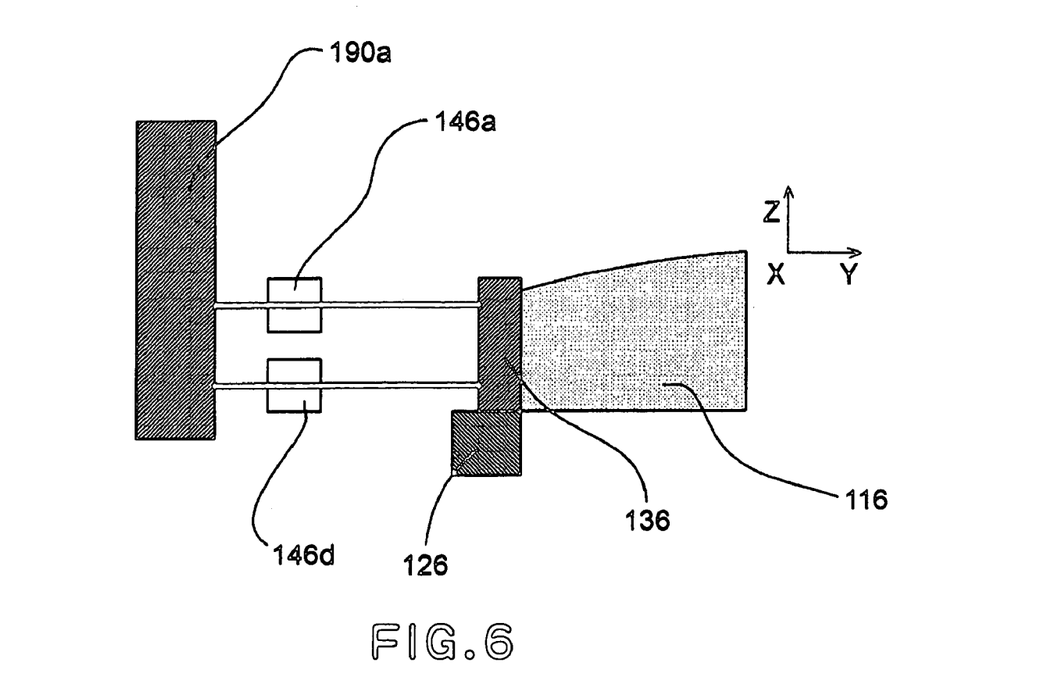
FIG. 6 is a schematic view of a portion of a second embodiment of the present invention

FIG. 6 is a schematic view of a portion of a second embodiment of the present invention.

In the second embodiment, as shown in

FIG. 6, two absolute length measurement interferometers 146d and 146e are juxtaposed along the Z-axis direction. With such disposition of the two absolute length measurement interferometers 146d and 146e, the position of the sixth mirror 116 with respect to the Wx axis (rotational axis about the X axis) can be measured. Thus, it becomes possible to adjust the position of the sixth mirror 116 with respect to the Wx direction. Furthermore, in regard to the target mirror 136c shown in FIG. 2, two absolute length measurement interferometers may be provided similarly and they may be juxtaposed along the Z-axis direction. This enables measurement of the position of the sixth mirror 116 with respect to the Wy axis, and thus the position adjustment of the sixth mirror in regard to the Wy axis can be done.

As described above, the second embodiment concerns an example wherein, as compared with the first embodiment, a plurality of absolute length measurement interferometers are juxtaposed along the Z-axis direction so as to assure the position of the sixth mirror 116 with respect to the reference mirror, in regard to two additional freedoms of Wx axis and Wy axis. With this structure, therefore, in addition to the three axes in the first embodiment, the position of the sixth mirror 116 is assured in two more axes.

In the second embodiment, regarding angles Wx, Wy and Wz, it is not always necessary to measure the relation of them with the reference mirrors 190a and 190b. While the distance measurement measures an optical path difference between a reference mirror and a target mirror, the angle measurement may be made with reference to the target mirror (the position spaced by a distance L) and, in that occasion, "(optical path difference)/L" corresponds to the angle. Thus, the angles Wx, Wy and Wz can be assured by measuring the distance between two spaced points on the target mirror.

Third Embodiment

A third embodiment of the present invention will be described below.

The first and second embodiments use a measuring system having absolute length measurement interferometers 141-146 for measurement of the positions, with respect to a reference mirror 190, of the target mirrors 131-136 which are provided close to or integral with the projection optical system mirrors (first to sixth mirrors 111-116). However, use of these absolute length measurement interferometers requires a light source of multiple wavelengths. Generally, in a measuring device that uses the wavelength of light as a reference, where the subject of measurement to be measured is longer than the wavelength, multiples of the wavelength by an integer as well as decimal portions based on measurement of its phase, are measured. However, in many cases, it is difficult to determine the integer portions. An absolute length measurement interferometer uses a multiple-wavelength light source, for determination of such integer portion.

As compared therewith, if the distance between the reference mirror and the target mirror can be assured separately at a precision higher than a half of the light source wavelength of the length measuring device, only execution of the phase measurement is enough. Namely, as long as the decimal portion of the wavelength described above can be determined, the position measurement can be performed.

The third embodiment uses a displacement sensor based on capacitance or eddy current, and the precision design is made such that an absolute precision including drift or the like of such sensor is less than a half of the measurement light. This effectively avoids use of an absolute length measurement interferometer.

The embodiments of the present invention described hereinbefore are not limited to a projection exposure apparatus, but they are applicable to any optical system that requires high optical performance. Particularly, the invention is suitable to an optical system like a projection optical system of a projection exposure apparatus that should have extraordinarily high optical performance. Further, where the invention is applied to an instrument having an optical system in which a portion surrounding the optical path should be kept at a high vacuum, as like a projection exposure apparatus using EUV light, or to an instrument having an optical system in which a portion surrounding the optical path should be filled with helium gas or nitrogen gas, since the present invention assures the optical performance without degrading the ambience around the optical path, the throughput can be improved significantly and the cost can be reduced significantly.

In accordance with the embodiments of the present invention described hereinbefore, measuring means measures an absolute position between each mirror of the projection optical system and a reference plane mirror mounted on a barrel, and fine-motion means performs corrective motion of the mirror position on the basis of easurement data obtained by the measuring means, this being done to precisely maintain the relative position of the mirrors constituting the projection optical system. With this arrangement, fine-motion correction can be performed after a periodic or non-periodic event such as power failure or transportation, and the optical performance initially adjusted can be reproduced and maintained.

Embodiment of Device Manufacturing Method

Next, an embodiment of a semiconductor device manufacturing method which uses a projection exposure apparatus described above, will be explained.

Figure 7:
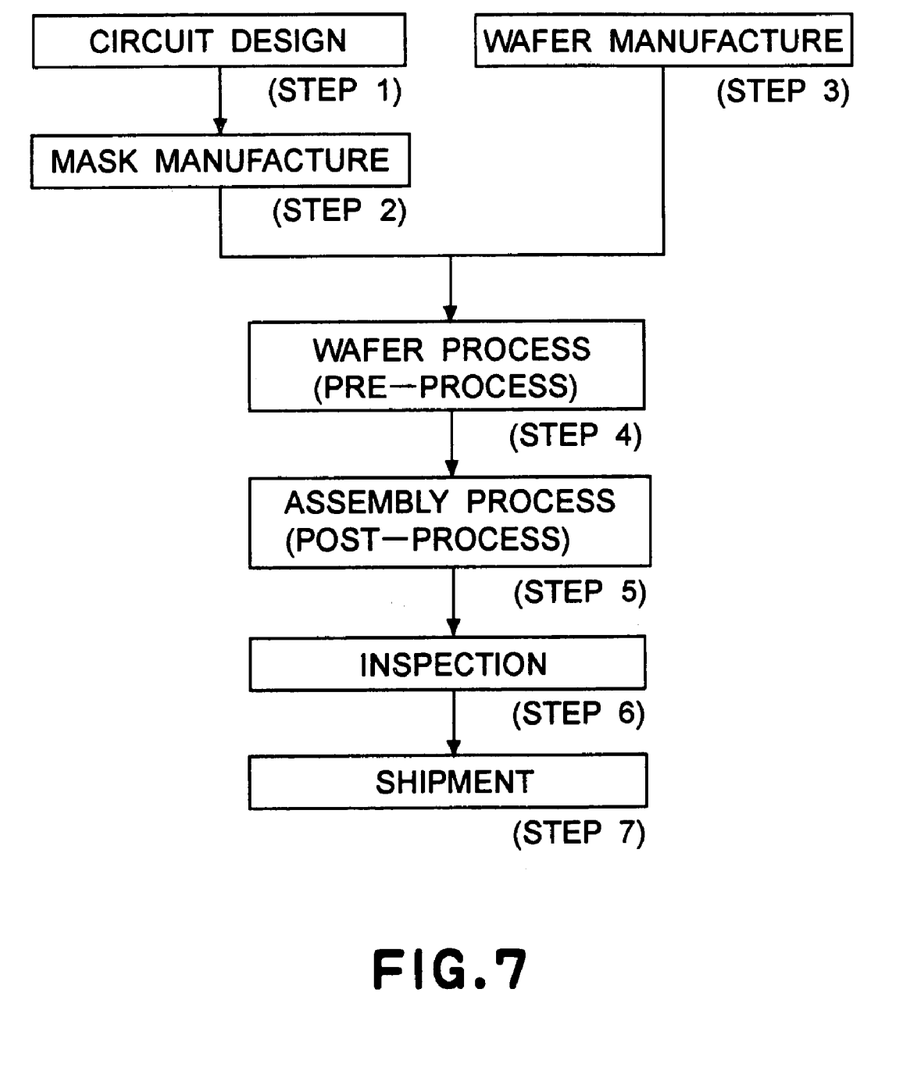
FIG. 7 is a flow chart for explaining semiconductor device manufacturing procedure, in an embodiment of the present invention.

FIG. 7 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 8:
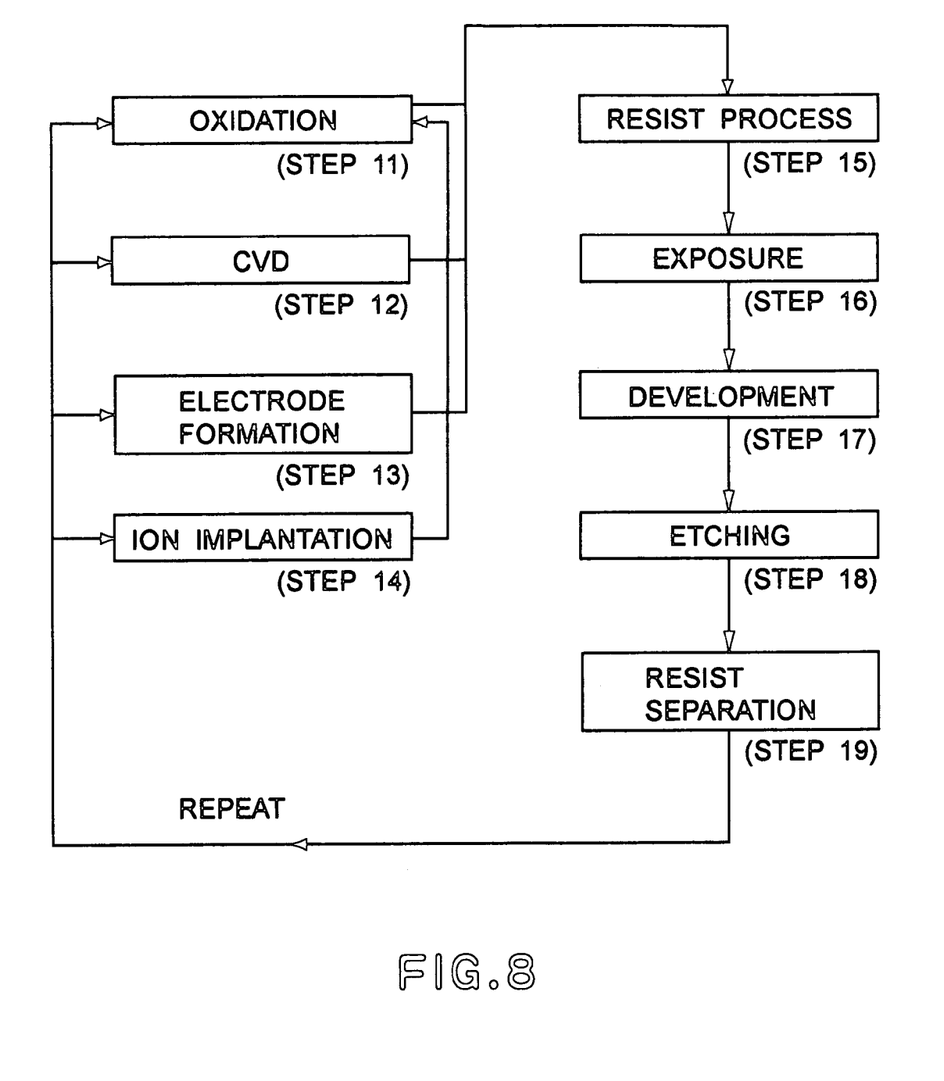
FIG. 8 is a flow chart for explaining details of a wafer process in the procedure of FIG. 7.

FIG. 8 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With the use of a projection exposure apparatus according to the embodiments as described above, high density microdevices can be manufactured.

The preferred embodiments of the present invention as described hereinbefore accomplish an optical instrument and a projection exposure apparatus having the same, by which the relative positional relationship of a plurality of optical elements held within a barrel can be maintained to assure best optical performance. Further, a reference member being structurally independent from the barrel, holding a projection optical system, may be provided, and measuring means for measuring an absolute distance of each optical element constituting the projection optical system, from the reference member, may be provided. With this arrangement, the relative positional relation of the optical elements having been accomplished at a certain time moment can be easily retrieved after an event such as transportation, long-term interruption, malfunction, changes with time and so on, wherein a change of the state is expected. As a result, an optical instrument or a projection exposure apparatus having the same by which good optical performance can be maintained stably, is accomplished.

While the invention has been described with reference to the structures disclosed herein, it is not confined to the details set forth and this application is intended to cover such modifications or changes as may come within the purposes of the improvements or the scope of the following claims.

What is claimed is:

1. An optical system having a plurality of optical elements, comprising:
   a reference mirror;
   a first measuring system for measuring a relative position, with respect to said reference mirror, of a first optical element among the plurality of optical elements and/or a first target mirror disposed so that a relative position thereof with respect to the first optical element is kept substantially unchanged;
   a second measuring system for measuring a relative position, with respect to said reference mirror, of a second optical element among the plurality of optical elements and/or a second target mirror disposed so that a relative position thereof with respect to the second optical element is kept substantially unchanged; and
   a driving mechanism for moving at least one of the first and second optical elements on the basis of a result of measurement made by said first and second measuring systems, so that a relative positional relationship between the first and second optical elements is placed in a predetermined positional relationship.

2. An optical system according to claim 1, wherein said first and second measuring systems have a function for measuring positional information of three or more freedoms, in relation to each of the first and second target mirrors.

3. An optical system according to claim 2, wherein, among the three freedoms, two freedoms are freedoms related to a coordinate axis representing a position, while the remaining one freedom is a freedom related to a coordinate axis representing rotation.

4. An optical system according to claim 1, wherein said first and second measuring systems have a function for measuring positional information of five or more freedoms, in relation to each of the first and second target mirrors.

5. An optical system according to claim 4, wherein, among the five freedoms, two freedoms are freedoms related to a coordinate axis representing a position, while the remaining three freedoms are freedoms related to a coordinate axis representing rotation.

6. An optical system according to claim 1, further comprising a barrel for supporting the first and second optical elements, wherein said reference mirror is provided outside the barrel.

7. An optical system according to claim 6, wherein said reference mirror is a member made of a low thermal expansion material and processed into a plane mirror with an anti-reflection film provided only in a required portion thereof.

8. An optical system according to claim 1, wherein said first and second measuring systems measure an absolute distance between said reference mirror and the first target mirror and between said reference mirror and the second target mirror, and wherein each of said first and second measuring systems includes an interferometer system based on a multiple-wavelength laser.

9. An optical system according to claim 1, wherein said first and second measuring systems measure a distance between said reference mirror and the first target mirror and between said reference mirror and the second target mirror, wherein each of said first and second measuring systems includes an interferometer system based on a single-wavelength laser, and wherein said optical system further comprises a displacement sensor provided in relation to an optical element of said optical system, the displacement sensor providing a positional precision of an order equivalent to a half of the wavelength of the single-wavelength laser.

10. An optical system according to claim 1, further comprising storing means for memorizing the relative position of the first and second optical elements of said optical system, in terms of distances of the first and second optical elements with respect to said reference mirror, wherein said driving mechanism moves the optical elements in corporation with said storing means.

11. An optical system according to claim 10, wherein said storing means stores the relative position of the optical elements in a state in which said optical system can provide a desired optical performance, in terms of the distance of the optical elements to said reference mirror.

12. An optical system according to claim 1, further comprising (i) a third measuring system for measuring a relative position, with respect to said reference mirror, of a third optical element among the plurality of optical elements and/or a third target mirror disposed so that a relative position thereof with respect to the third optical element in kept substantially unchanged, (ii) a fourth measuring system for measuring a relative position, with respect to said reference mirror, of a fourth optical element among the plurality of optical elements and/or a fourth target mirror disposed so that a relative position thereof with respect to the fourth optical element is kept substantially unchanged, (iii) a fifth measuring system for measuring a relative position, with respect to said reference mirror, of a fifth optical element among the plurality of optical elements and/or a fifth target mirror disposed so that a relative position thereof with respect to the fifth optical element is kept substantially unchanged, (iv) a sixth measuring system for measuring a relative position, with respect to said reference mirror, of a sixth optical element among the plurality of optical elements and/or a sixth target mirror disposed so that a relative position thereof with respect to the sixth optical element is kept substantially unchanged, and (v) a second driving mechanism for moving at least five optical elements of the first to sixth optical elements on the basis of a result of measurement made by said first to sixth measuring systems, so that a relative positional relationship of the first to sixth optical elements are placed in a predetermined positional relationship.

13. An optical system according to claim 1, wherein all the optical elements are reflection members.

14. An optical system according to claim 1, further comprising storing means for memorizing an optimum relative positional relationship of the plurality of optical elements, wherein said driving-mechanism moves at least one of the plurality of optical elements on the basis a result of measurement made by said measuring systems and the optimum positional relationship memorized in said storing means.

15. An exposure apparatus including an optical system as recited in claim 1.

16. An exposure apparatus, comprising:
   an illumination optical system for illuminating a pattern with light from a light source; and
   an optical system as recited in claim 1 for projecting light from the pattern onto a member to be exposed.

17. An apparatus according to claim 15, further comprising a barrel for holding the plurality of optical elements, and a barrel base for supporting said barrel, wherein said reference mirror is separate from said barrel and is mounted on said barrel base.

18. An apparatus according to claim 15, further comprising a barrel for holding the plurality of optical elements, a barrel base for supporting said barrel, and a first anti-vibration mechanism disposed between said barrel base and a floor, for reducing vibration propagated from said floor to said barrel base.

19. An apparatus according to claim 15, further comprising a barrel for holding the plurality of optical elements, a barrel base for supporting said barrel, a first anti-vibration mechanism disposed between said barrel base and a floor, for reducing vibration propagated from said floor to said barrel base, a mirror base for supporting said reference mirror, and a second anti-vibration mechanism disposed between said mirror base and said floor, for reducing vibration propagated from said floor to said mirror base.

20. An apparatus according to claim 19, wherein, with regard to at least a portion of vibration of said barrel base, said mirror base is controllably vibrated in synchronism therewith.

21. A device, manufacturing method, comprising the steps of:
exposing a wafer by use of an exposure apparatus as recited in claim 15 and developing the exposed wafer.

22. An optical instrument, comprising:
a plurality of optical elements;
a barrel for holding the plurality of optical elements;
a target mirror arranged so that a relative position thereof with respect to one or more optical elements of the plurality of optical elements is kept substantially unchanged;
driving means for moving the one or more optical elements;
a reference mirror provided outside said barrel;
measuring means for measuring a position of said target mirror with respect to said reference mirror; and
storing means for memorizing an optimum relative positional relationship of the plurality of optical elements,
wherein said driving means moves at least one of the plurality of optical elements on the basis of a result of measurement made by said measuring means and of the optimum positional relationship memorized in said storing means.

23. An exposure apparatus, comprising:
an illumination optical system for illuminating a pattern with light from a light source; and
an optical system as recited in claim 2, for projecting light from the pattern onto a member to be exposed.

24. An exposure apparatus, comprising:
an illumination optical system for illuminating a pattern with light from a light source; and
an optical system as recited in claim 3, for projecting light from the pattern onto a member to be exposed.

25. An exposure apparatus, comprising:
an illumination optical system for illuminating a pattern with light from a light source; and
an optical system as recited in claim 4, for projecting light from the pattern onto a member to be exposed.

26. An exposure apparatus, comprising:
an illumination optical system for illuminating a pattern with light from a light source; and
an optical system as recited in claim 5, for projecting light from the pattern onto a member to be exposed.

27. An exposure apparatus, comprising:
an illumination optical system for illuminating a pattern with light from a light source; and
an optical system as recited in claim 6, for projecting light from the pattern onto a member to be exposed.

28. An exposure apparatus, comprising:
an illumination optical system for illuminating a pattern with light from a light source; and
an optical system as recited in claim 7, for projecting light from the pattern onto a member to be exposed.

29. An exposure apparatus, comprising:
an illumination optical system for illuminating a pattern with light from a light source; and
an optical system as recited in claim 8, for projecting light from the pattern onto a member to be exposed.

30. An exposure apparatus, comprising:
an illumination optical system for illuminating a pattern with light from a light source; and
an optical system as recited in claim 9, for projecting light from the pattern onto a member to be exposed.

31. An exposure apparatus, comprising:
an illumination optical system for illuminating a pattern with light from a light source; and
an optical system as recited in claim 10, for projecting light from the pattern onto a member to be exposed.

32. An exposure apparatus, comprising:
an illumination optical system for illuminating a pattern with light from a light source; and
an optical system as recited in claim 11, for projecting light from the pattern onto a member to be exposed.

33. An exposure apparatus, comprising:
an illumination optical system for illuminating a pattern with light from a light source; and
an optical system as recited in claim 12, for projecting light from the pattern onto a member to be exposed.

34. An exposure apparatus, comprising:
an illumination optical system for illuminating a pattern with light from a light source; and
an optical system as recited in claim 13, for projecting light from the pattern onto a member to be exposed.

35. An exposure apparatus, comprising:
an illumination optical system for illuminating a pattern with light from a light source; and
an optical system as recited in claim 14, for projecting light from the pattern onto a member to be exposed.

* * * * *